United States Patent
Lin et al.

(10) Patent No.: US 7,663,463 B2
(45) Date of Patent: Feb. 16, 2010

(54) INDUCTOR STRUCTURE

(75) Inventors: Hsiao-Chu Lin, Taipei Hsien (TW); Sheng-Yuan Lee, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 98 days.

(21) Appl. No.: 11/936,270

(22) Filed: Nov. 7, 2007

(65) Prior Publication Data
US 2009/0045903 A1   Feb. 19, 2009

(30) Foreign Application Priority Data
Aug. 17, 2007   (TW)   ............... 96130466 A (51) Int. Cl.
*H01F 5/00*   (2006.01)
(52) U.S. Cl. .................................... 336/200
(58) Field of Classification Search ............... 336/65, 336/83, 200, 232; 257/531
See application file for complete search history.

(56) References Cited

U.S. PATENT DOCUMENTS

| | | | | |
|---|---|---|---|---|
| 5,446,311 | A  * | 8/1995 | Ewen et al. ............... | 257/531 |
| 6,002,161 | A  * | 12/1999 | Yamazaki ................... | 257/531 |
| 6,489,663 | B2 * | 12/2002 | Ballantine et al. .......... | 257/531 |
| 6,650,220 | B2 * | 11/2003 | Sia et al. .................... | 336/200 |
| 7,135,951 | B1 * | 11/2006 | Sidhu et al. ................. | 336/200 |
| 7,233,224 | B2 * | 6/2007 | Strzalkowski et al. ....... | 336/200 |
| 7,382,222 | B1 * | 6/2008 | Manetakis .................. | 336/200 |
| 7,504,923 | B1 * | 3/2009 | Lin et al. .................... | 336/200 |
| 2002/0158306 | A1 * | 10/2002 | Niitsu ........................ | 257/531 |
| 2004/0140528 | A1 * | 7/2004 | Kim et al. ................... | 257/537 |
| 2006/0284719 | A1 * | 12/2006 | Lee ............................ | 336/223 |

* cited by examiner

*Primary Examiner*—Tuyen Nguyen
(74) *Attorney, Agent, or Firm*—J.C. Patents (57) ABSTRACT

An inductor structure including a coil layer and at least a gain lead is disclosed. The coil layer is disposed over a substrate and has a plurality of coil turns, wherein one of the coil turns is grounded. The gain lead is disposed under at least one of the inner side and the outer side of the grounded coil turn and is electrically connected in parallel to the grounded coil turn. The width of the gain lead is less than the width of the grounded coil turn.

20 Claims, 5 Drawing Sheets

INDUCTOR STRUCTURE

CROSS-REFERENCE TO RELATED APPLICATION

This application claims the priority benefit of Taiwan application serial no. 96130466, filed Aug. 17, 2007. All disclosure of the Taiwan application is incorporated herein by reference.

BACKGROUND OF THE INVENTION

1. Field of the Invention

The present invention generally relates to an inductor structure, and more particularly, to an inductor structure having gain leads.

2. Description of Related Art

In general speaking, since an inductor has energy storing and releasing functions, the inductor can be used as an element for stabilizing current. In an integrated circuit (IC), an inductor plays a very important and extreme challenging role and serves as a component, and an inductor is broadly applicable in many fields, such as in radio frequency circuit (RF circuit). In terms of the RF application hereof, an inductor with higher quality means the inductor has a higher quality factor represented by Q-factor, which is defined by:

$$Q = \omega \times L/R$$

where $\omega$ is angular frequency, L is inductance of the inductor coil and R is resistance considering inductance loss under specific frequencies.

There are various methods and techniques today available for incorporating an inductor with IC process. However, in an IC, the limitation of the conductor thickness of an inductor and the interference on an inductor by a silicon substrate would degrade the quality of the inductor. To overcome the problem in the prior art, the conductor loss is reduced by disposing a thicker metal element at the uppermost layer of the inductor so as to advance the Q-factor of inductor. When the above-mentioned metal thickness is increased to a certain degree, the Q-factor improvement becomes not notable.

To overcome the above-mentioned difficulty, in the prior art, a gain lead is employed and disposed under the grounded coil turn, where the gain lead is electrically connected to the coil turn, so as to increase the section area of conductor in the inductor structure which is able to effectively lower conductor loss and advance the quality of the inductor.

Note that although the grounded coil produces an electrical field with a weaker intensity, and the parasitic capacitance caused by the coupling between the gain lead and the substrate of the inductor structure is less; however, the parasitic capacitance does negatively affect the inductance quality of the inductor structure.

SUMMARY OF THE INVENTION

Accordingly, the present invention is directed to an inductor structure capable of improving conductor loss of inductor and advancing the inductor quality.

The present invention provides an inductor structure which includes a coil layer and at least a gain lead. The coil layer is disposed over a substrate and has a plurality of coil turns, wherein one of coil turns of the coil layer is grounded. The gain lead is disposed under at least one of the inner side and the outer side of the grounded coil turn, is electrically connected in parallel to the grounded coil turn and has a width less than the width of the grounded coil turn.

The present invention also provides an inductor structure which includes a coil layer and at least a gain lead. The coil layer includes a first spiral coil and a second spiral coil. The first spiral coil has a first end and a second end, wherein the second end rotates in spiral way towards the inner portion of the first spiral coil. The second spiral coil and the first spiral coil are intertwisted to each other and symmetrically disposed about a plane of symmetry. The second spiral coil has a third end and a fourth end, wherein the fourth end rotates in spiral way towards the inner portion of the second spiral coil and is connected to the second end of the first spiral coil so as to form the coil layer having a plurality of coil turns and form a virtual grounding at the most-inner coil turn of the coil layer. The gain lead is disposed under at least one of the inner side and the outer side of the most-inner coil turn and connects in parallel the most-inner coil turn, and the width of the gain lead is less than the width of the most-inner coil turn.

The present invention further provides an inductor structure which includes a coil layer and at least a gain lead. The coil layer is disposed over a substrate and formed by a plurality of coil turns in series, the coil layer has a first end and a second end, wherein the first end is grounded. The gain lead is disposed under at least one of the inner side and the outer side of the first coil turn counted from the first end and is electrically connected in parallel to the first coil turn, and the width of the gain lead is less than the width of the first coil turn.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In the following, the inner side and the outer side of a coil turn are respectively defined as a side close to the inner portion (core portion) of the inductor structure and a side departing from the inner portion of the inductor structure.

In an inductor structure, the regions with the highest current density occur respectively at the inner side and the outer side of the grounded coil turn. Accordingly, in the inductor structure provided by the present invention, at least a gain lead is coupled with the grounded coil turn under at lease one of the inner side and the outer side of the grounded coil turn, so as to effectively increase section area of conductor and thereby reduce conductor loss. In addition, in the inductor structure provided by the present invention, the width of the gain lead is less than the width of the above-mentioned grounded coil turn. A narrower gain lead is able to further reduce the parasitic capacitance between the gain lead and the substrate and to gain better inductor quality.

Figure 1:
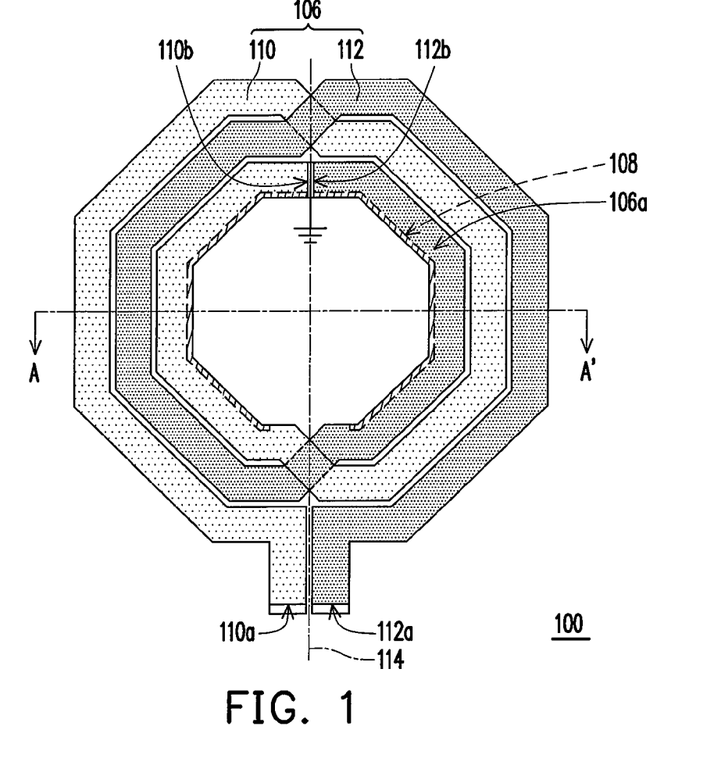
FIG. 1 is a schematic top view of the inductor structure of the first embodiment of the present invention.
Figure 2:
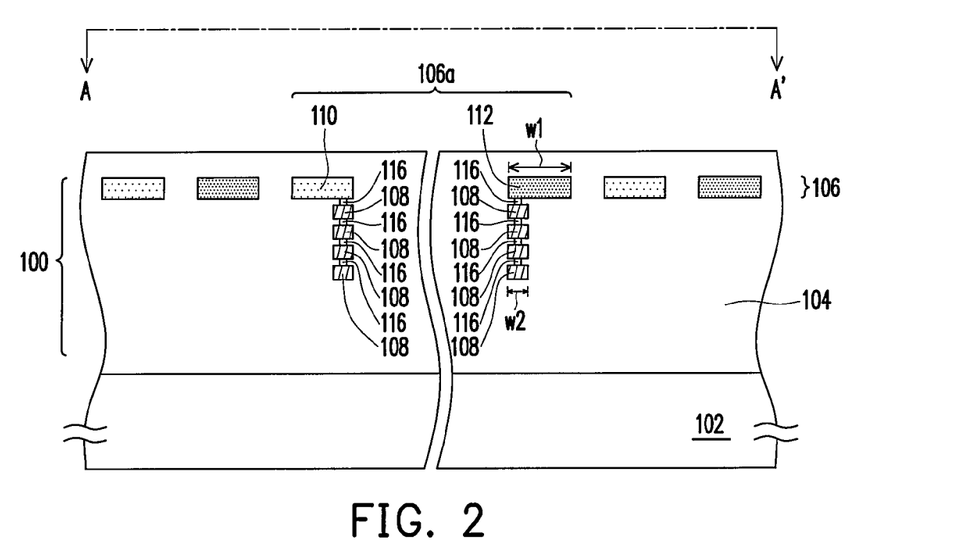
FIG. 2 is a cross-sectional diagram along line A-A' in FIG. 1.

FIG. 1 is a schematic top view of the inductor structure of the first embodiment of the present invention and FIG. 2 is a cross-sectional diagram along line A-A' in FIG. 1.

Referring to FIGS. 1 and 2, an inductor structure 100 includes a coil layer 106 and at least a gain lead 108, wherein the coil layer 106 and the gain lead 108 are disposed in a dielectric layer 104 on a substrate 102. The inductor structure 100 may be implemented by a semiconductor process, thus, the substrate 102 may be a silicon substrate. The material of the dielectric layer 104 is, for example, silicon oxide or other dielectric materials. The material of the coil layer 106 may be metal, for example, copper or aluminum copper alloy etc. The material of the gain lead 108 may be conductive material, for example, polysilicon semiconductor material or metal material such as copper, aluminum copper alloy. In addition, in the embodiment, the inductor structure 100 has a shape, but not limited by the present invention, of octagon (as shown in FIG. 1).

The coil layer 106 includes two spiral coils 110 and 112, wherein the two spiral coils 110 and 112 are disposed, for example, on a same height plane. The coil layer 106 is, for example, a symmetrical spiral coil structure with a plurality of coil turns; in the embodiment, the coil layer 106 is, but not limited by the present invention, a symmetrical spiral coil structure with three coil turns. The spiral coil 110 and the spiral coil 112 are, for example, mirror-symmetrically disposed about a plane of symmetry 114 and intertwisted to each other, wherein the plane of symmetry 114 extends, for example, towards the page. For example, the spiral coil 110 and the spiral coil 112 are interlaced with each other on the plane of symmetry 114 and do not contact each other at the interlaced positions; for example, one underruns another at an interlaced position by means of a via plug or an intertrace so as to avoid a short circuit.

The spiral coil 110 has an end 110a and another end 110b, wherein the end 110a is disposed at an outer portion of the spiral coil 110 and the end 110b rotates in spiral way towards the inner portion of the spiral coil 110.

The spiral coil 112 and the spiral coil 110 are intertwisted to each other in a symmetric way about the plane of symmetry 114, and are connected in series to each other. The spiral coil 112 has an end 112a and another end 112b, wherein the end 112a is disposed at an outer portion of the spiral coil 112 correspondingly to the position of the end 110a and the end 112b rotates in spiral way towards the inner portion of the spiral coil 112 correspondingly to the position of the end 110b. The ends 110b and 112b are connected to each other about the plane of symmetry 114. The spiral coil 112 and the spiral coil 110 are intersected and connected to each other at the most-inner coil turn of the coil layer 106.

Further, when operating the inductor structure 100, for example, operation voltages would be applied simultaneously to the ends 110a and 112a. The operation voltage applied to the end 110a and the operation voltage applied to the end 112a has, for example, the same absolute level but opposite polarities. Therefore, in the spiral structure composed of the spiral coil 110 and the spiral coil 112, from the ends 110a and 112a up, the more close to the inner portion of the spiral coils 110 and 112, the more descending the absolute level of the voltage is. The voltage at the connection of the end 110a (of the spiral coil 110) and the end 112a (of the spiral coil 112) would be zero, which means a virtual grounding situation occurs at the most-inner coil turn 106a of the coil layer 106; the above-mentioned case is named as a symmetrical differential inductor application.

The gain lead 108 is disposed under the inner side of the coil turn 106a and electrically connected in parallel to the inner side of the coil turn 106a, so that the sections of the coil turn 106a of the coil layer 106 and the gain lead 108 along a cross-sectional plane together have an upsidedown-L-shape and are perpendicular to the substrate 102.

In addition, the width W2 of the gain lead 108 is less than the width W1 of the coil turn 106a. The width W2 of the gain lead 108 is less than, for example, a half of the width W1 of the coil turn 106a. In practice, anyone skilled in the art is allowed to adjust the width W2 of the gain lead 108 to meet the demand thereof.

On the other hand, the gain lead 108 is coupled with the coil turn 106a in this way, for example, by means of a plurality of via plug 116 to respectively connect in parallel the two ends of the gain lead 108 to the coil turn 106a. For a case of a plurality of gain leads 108 (there are four gain leads 108 as shown by FIG. 2), any two up and down adjacent gain leads 108 connect in parallel by, for example, a plurality of via plugs 116. Although the embodiment exemplarily takes four gain leads 108, but anyone skilled in the art is allowed to adjust the number of the gain leads 108 to meet the demand thereof.

It can be seen from the above-mentioned, once at least a gain lead 108 is disposed under the inner side of the coil turn 106a, it is able to effectively increase conductor section area and further reduce conductor loss. In addition, since the width W2 of the gain lead 108 is less than the width W1 of the coil turn 106a, it would further prevent larger parasitic capacitance induced between the gain lead 108 and the substrate 102 to improve the quality of the inductor.

Figure 3:
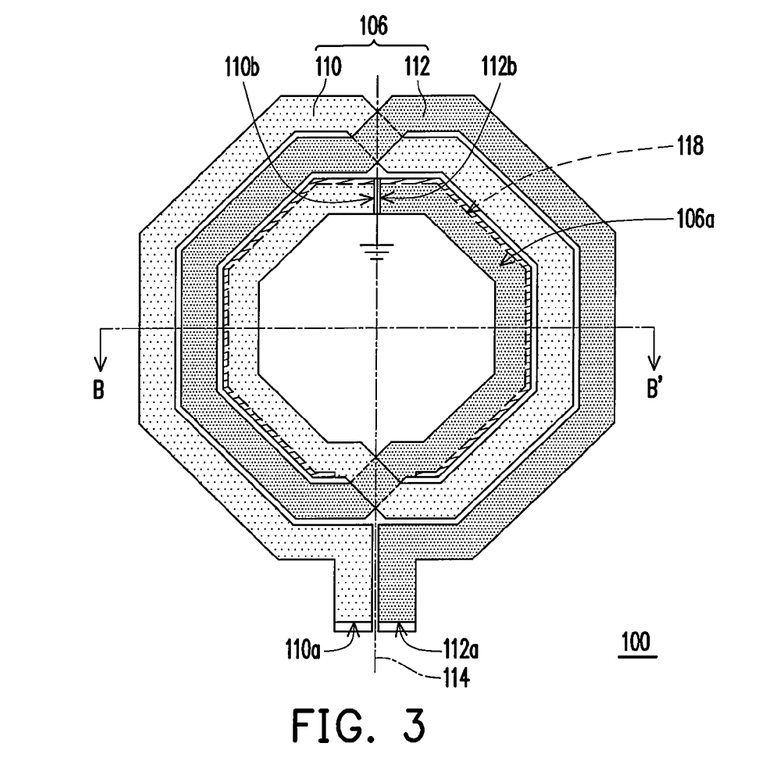
FIG. 3 is a schematic top view of the inductor structure of the second embodiment of the present invention.
Figure 4:
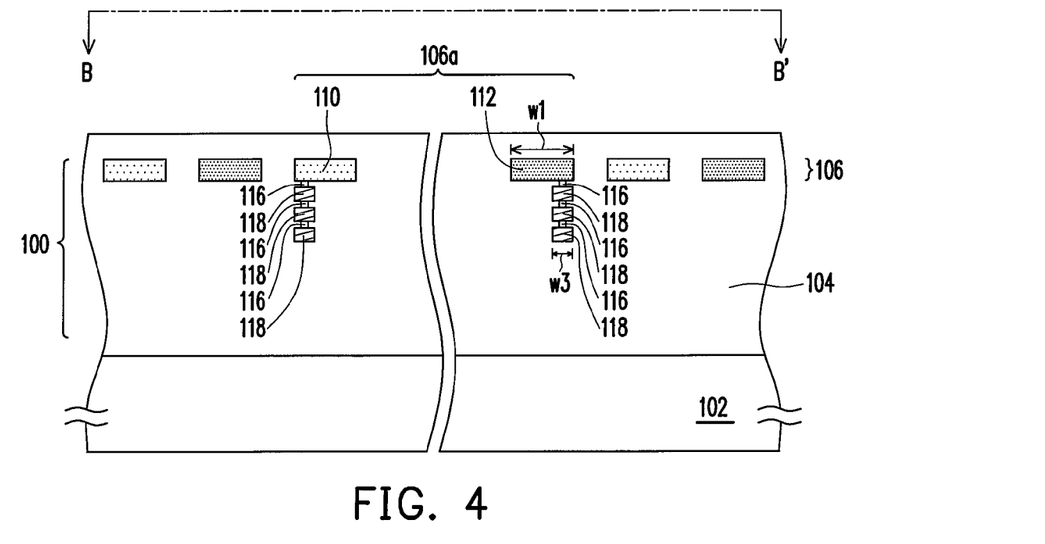
FIG. 4 is a cross-sectional diagram along line B-B' in FIG. 3.

FIG. 3 is a schematic top view of the inductor structure of the second embodiment of the present invention and FIG. 4 is a cross-sectional diagram along line B-B' in FIG. 3. In FIGS. 3 and 4, all the same elements as FIGS. 1 and 2 are notated by the same marks without specific depiction.

Referring to FIGS. 1-4, an inductor structure 100 in FIGS. 3 and 4 provided by the second embodiment includes a coil layer 106 and at least a gain lead 118, wherein the gain lead 118 is disposed under the outer side of the coil turn 106a of the coil layer 106 and is electrically connected in parallel to the outer side of the coil turn 106a, so that the sections of the coil turn 106a of the coil layer 106 and the gain lead 118 along a cross-sectional plane together have an upsidedown-L-shape. The difference of the second embodiment from the first embodiment is the gain lead 118 in the second embodiment is electrically connected to the coil turn under the outer side of the coil turn 106a, instead the gain lead 108 is electrically connected to the coil turn under the inner side of the coil turn 106a in the first embodiment.

The width W3 of the gain lead 118 is less than the width W1 of the coil turn 106a. The width W3 of the gain lead 118 is less than, for example, a half of the width W1 of the coil turn 106a. In practice, anyone skilled in the art is allowed to adjust the width W3 of the gain lead 118 to meet the demand thereof.

On the other hand, the gain lead 118 is coupled with the coil turn 106a in this way, for example, by means of a plurality of via plug 116 to respectively connect in parallel the two ends of the gain lead 118 to the coil turn 106a. For a case of a plurality of gain leads 118 (there are three gain leads 118 as shown by FIG. 4), any two up and down adjacent gain leads 118 are in connection in parallel by, for example, a plurality of via plugs 116. Although the embodiment exemplarily takes three gain leads 118, but anyone skilled in the art is allowed to adjust the number of the gain leads 118 to meet the demand thereof.

It can be seen from the above-mentioned, once at least a gain lead 118 is disposed under the outer side of the coil turn 106a, it is able to effectively increase conductor section area and further reduce conductor loss. In addition, since the width W3 of the gain lead 118 is less than the width W1 of the coil turn 106a, it would further prevent larger parasitic capacitance induced between the gain lead 118 and the substrate 102 to improve the quality of the inductor.

Figure 5:
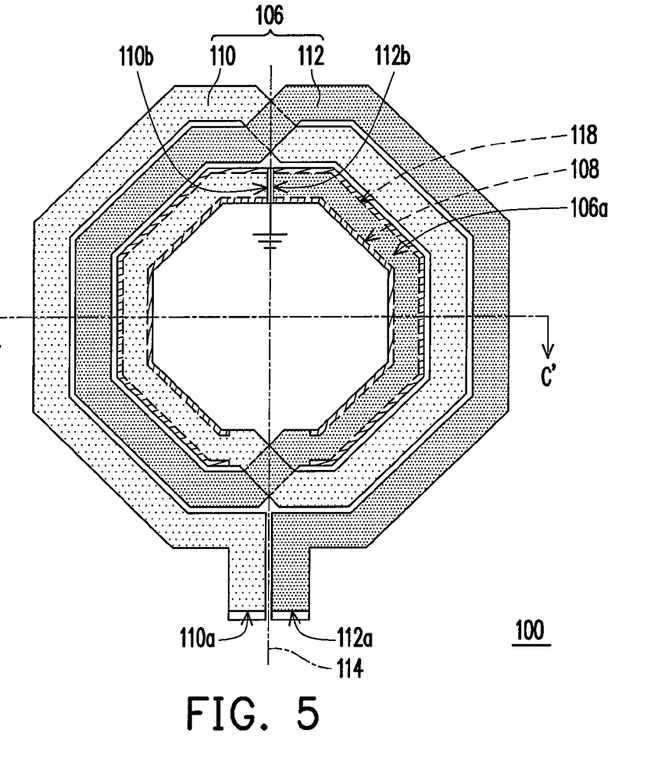
FIG. 5 is a schematic top view of the inductor structure of the third embodiment of the present invention.
Figure 6:
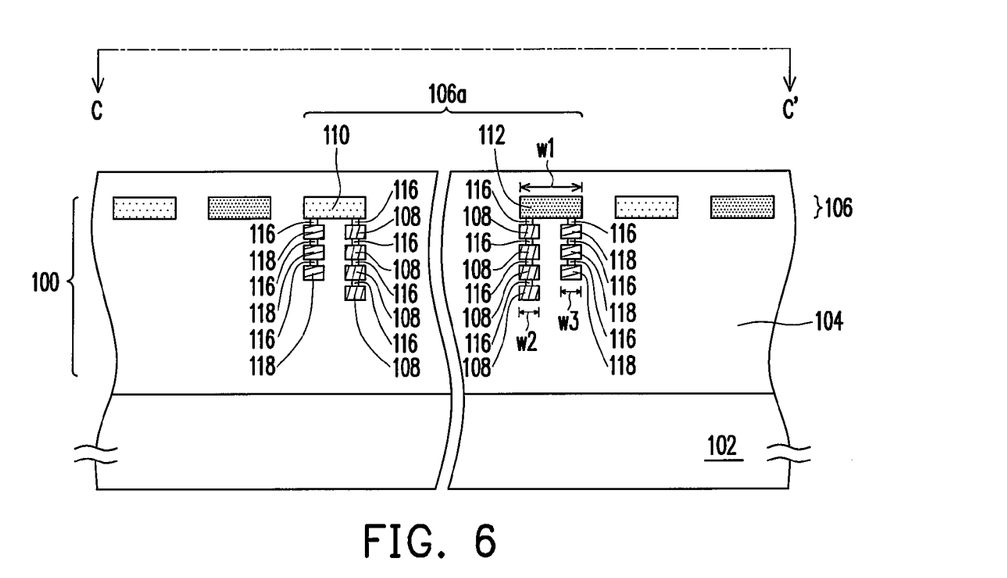
FIG. 6 is a cross-sectional diagram along line C-C' in FIG. 5.

FIG. 5 is a schematic top view of the inductor structure of the third embodiment of the present invention and FIG. 6 is a cross-sectional diagram along line C-C' in FIG. 5. In FIGS. 5 and 6, all the same elements as FIGS. 1-4 are notated by the same marks without specific depiction.

Referring to FIGS. 1-6, an inductor structure 100 in FIGS. 5 and 6 provided by the third embodiment includes a coil layer 106, at least a gain lead 108 and at least a gain lead 118. The difference of the third embodiment from the first embodiment and the second embodiment is two gain leads 108 and 118 in the third embodiment are disposed and electrically connected to the coil turn 106a under the inner side and the outer side of the coil turn 106a, so that the sections of the coil turn 106a of the coil layer 106 and the gain leads 108 and 118 along a cross-sectional plane together have an upsidedown-U-shape. However in the first embodiment and the second embodiment, a gain lead 108 and a gain lead 118 are respectively disposed under one of the inner side and the outer side of the coil turn 106a; therefore, no matter the sections of the coil turn 106a of the coil layer 106 and the gain lead 108 along a cross-sectional plane together or the sections of the coil turn 106a of the coil layer 106 and the gain lead 118 along a cross-sectional plane together have an upsidedown-L-shape. Besides, the gain leads 108 and 118 and other elements of the inductor structure 100 in the third embodiment have almost the same materials and functions as the first and second embodiments, which are omitted to describe herein.

Note that the summation of the width W2 of the gain lead 108 and the width W3 of the gain lead 118 is less than the width W1 of the coil turn 106a, and anyone skilled in the art is allowed to adjust the widths W2 and W3 to meet the demand thereof.

Although in the embodiment, the number of the gain leads 108 (four) is greater than the number of the gain leads 118 (three), but in other embodiments, the number of the gain leads 108 can be less than or equal to the number of the gain leads 118 to meet the product requirement.

Figure 7:
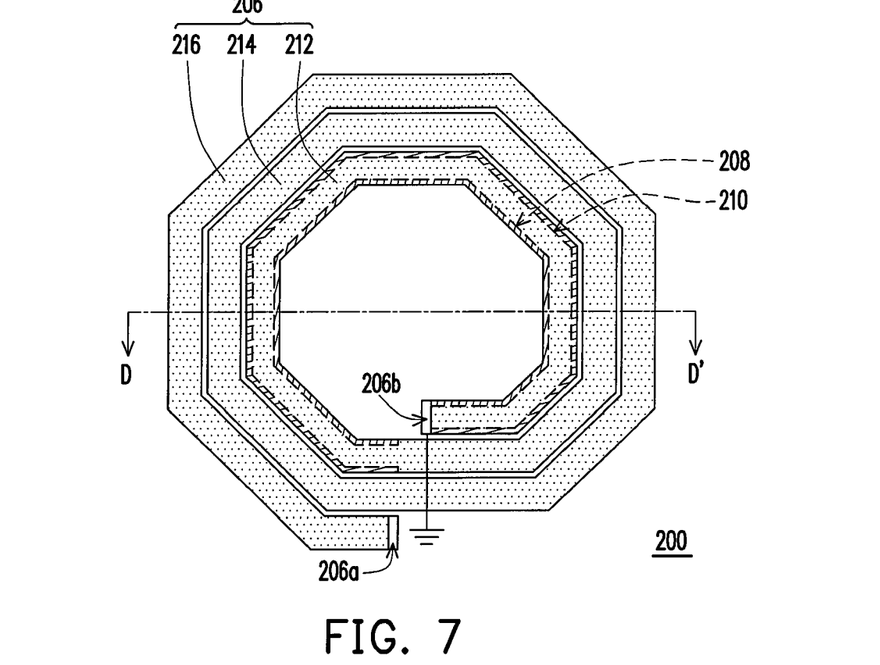
FIG. 7 is a schematic top view of the inductor structure of the fourth embodiment of the present invention.
Figure 8:
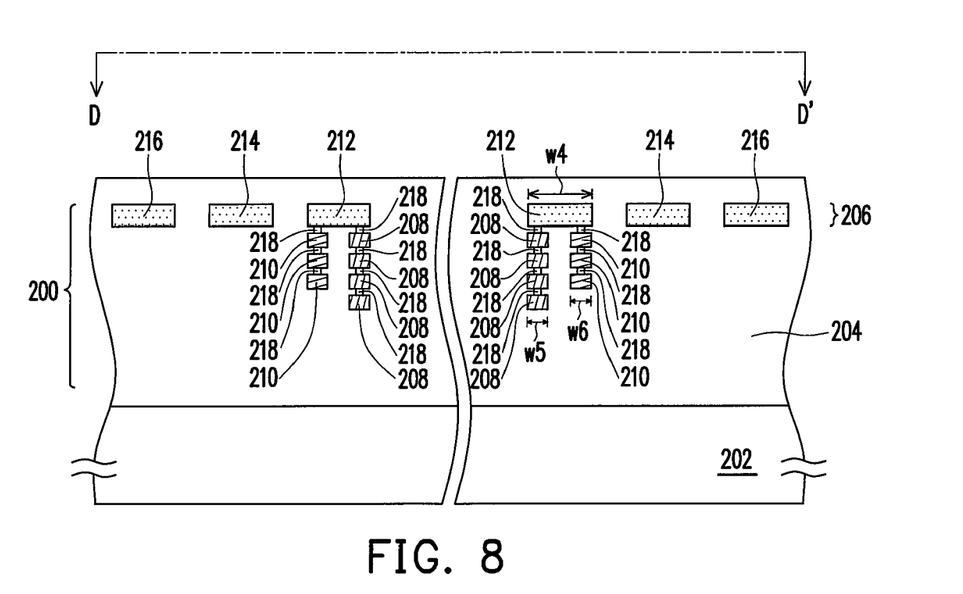
FIG. 8 is a cross-sectional diagram along line D-D' in FIG. 7.

FIG. 7 is a schematic top view of the inductor structure of the fourth embodiment of the present invention and FIG. 8 is a cross-sectional diagram along line D-D' in FIG. 7.

Referring to FIGS. 7 and 8, an inductor structure 200 includes a coil layer 206, at least a gain lead 208 and at least a gain lead 210, wherein the coil layer 206 and the gain leads 208 and 210 are disposed in a dielectric layer 204 on a substrate 202. The inductor structure 200 may be implemented by a semiconductor process, thus, the substrate 202 may be a silicon substrate. The material of the dielectric layer 204 is, for example, silicon oxide or other dielectric materials. The material of the coil layer 206 may be metal, for example, copper or aluminum copper alloy etc. The materials of the gain leads 208 and 210 may be conductive material, for example, polysilicon semiconductor material or metal material such as copper, aluminum copper alloy. In addition, in the embodiment, the inductor structure 200 has a shape, but not limited by the present invention, of octagon (as shown in FIG. 7).

The coil layer 206 is, for example, a spiral coil structure with three coil turns composed of coil turns 212, 214 and 216 all three coil turns are connected in series; however, the present invention is not limited to three coil turns only.

The coil layer 206 has two ends 206a and 206b, wherein the end 206b is located on the most-inner coil turn 212 of the inductor structure 200, the end 206a is located on the most-outer coil turn 216 of the inductor structure 200, the end 206b is grounded and another end 206a connects an operation voltage, which is corresponding to a single-ended inductor application.

The gain leads 208 and 210 are respectively disposed under the inner side and the outer side of the first (most-inner) coil turn 212 counted from the end 206b and are respectively electrically connected in parallel to the inner side and the outer side of the coil turn 212, so that the sections of the coil turn 212 of the coil layer 206 and the gain leads 208 and 210 along a cross-sectional plane together have an upsidedown-U-shape.

In addition both the width W5 of the gain lead 208 and the width W6 of the gain lead 210 are less than the width W4 of the coil turn 212. Both the width W5 of the gain lead 208 and the width W6 of the gain lead 210 are, for example, less than a half of the width W4 of the coil turn 212, but anyone skilled in the art is allowed to adjust the widths W5 and W6 to meet the demand thereof.

Note that the summation of the width W5 of the gain lead 208 and the width W6 of the gain lead 210 would be less than the width W4 of the coil turn 212. As to detail relationships between W5 and W6 are adjustable depending on the product requirement.

Although in the embodiment, the number of the gain leads 208 (four) is greater than the number of the gain leads 210 (three), but in other embodiments, the numbers of the gain leads 208 and 210 are different from the fourth embodiment, that is to say the number of the gain leads 208 can be less than or equal to the number of the gain leads 210 to meet the product requirement.

On the other hand, the gain leads 208 and 210 are coupled with the coil turn 212 in this way, for example, by means of a plurality of via plug 218 to respectively connect in parallel the two ends of the gain leads 208 and 210 to the coil turn 212. For a case of a plurality of gain leads 208 and a plurality of gain leads 210, any two up and down adjacent gain leads 208 or any two up and down adjacent gain leads 210 are connected in parallel to each other by, for example, a plurality of via plugs 218.

It can be seen from the above described in the embodiment, since a gain lead 208 and a gain lead 210 are respectively electrically connected to the coil turn under the inner side and the outer side of the grounded coil turn 212, the conductor section area is effectively increased and thereby the conductor loss is reduced. In addition, the summation of the width W5 of the gain lead 208 and the width W6 of the gain lead 210 would be less than the width W4 of the coil turn 212, which further prevent larger parasitic capacitance induced between the gain leads 208 and 210 and the substrate 202 to gain a better quality of the inductor.

In the embodiment, although the architecture is that the gain leads 208 and 210 are respectively electrically connected to the coil turn under the inner side and the outer side of the grounded coil turn 212, but the present invention is not limited to the architecture. In other embodiments, only at least a gain lead 208 is electrically connected to the coil turn under the inner side of the grounded coil turn 212 so that the sections of the coil turn 212 and the gain lead 208 along a cross-sectional plane together have an upsidedown-L-shape, or only at least a gain lead 210 is electrically connected to the coil turn under the outer side of the grounded coil turn 212 so that the sections of the coil turn 212 and the gain lead 210 along a cross-sectional plane together have an upsidedown-L-shape; all of the architectures are able to achieve the goal of the present invention. The above-mentioned architectures are the similar to the first and second embodiments, thus, they are omitted to describe.

Figure 9:
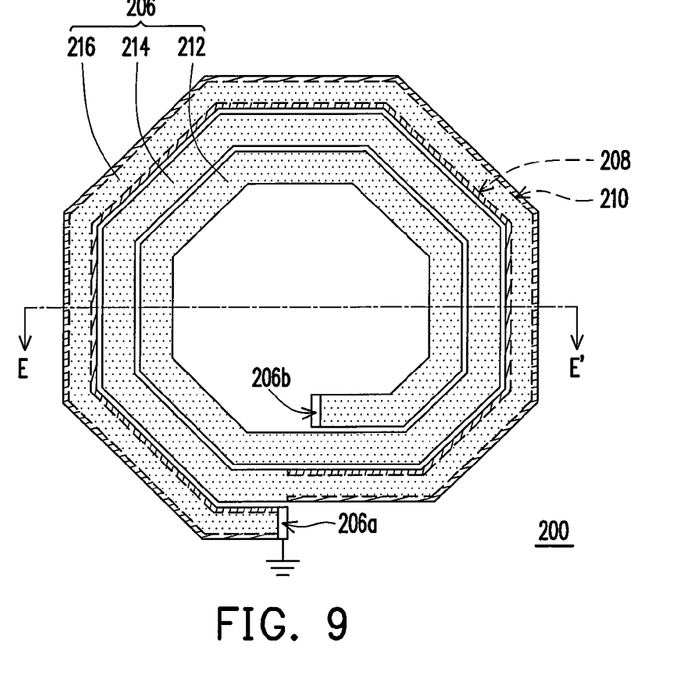
FIG. 9 is a schematic top view of the inductor structure of the fifth embodiment of the present invention.
Figure 10:
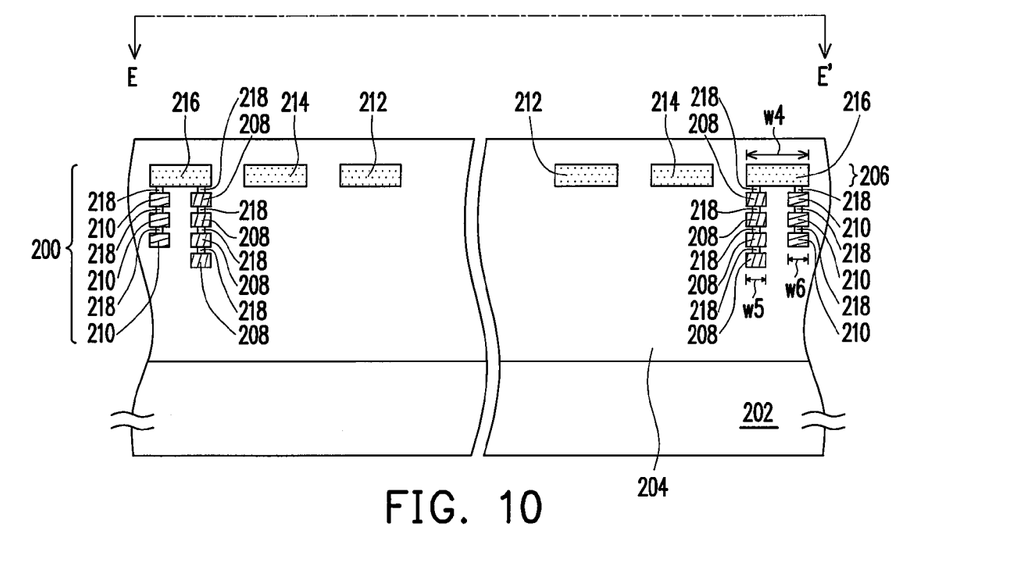
FIG. 10 is a cross-sectional diagram along line E-E' in FIG. 9.

FIG. 9 is a schematic top view of the inductor structure of the fifth embodiment of the present invention and FIG. 10 is a cross-sectional diagram along line E-E' in FIG. 9. In FIGS. 9 and 10, all the same elements as FIGS. 7 and 8 are notated by the same marks without specific depiction.

Referring FIGS. 7-10, the difference of the fifth embodiment in FIGS. 9 and 10 from the embodiment in FIGS. 7 and 8 is the end 206a in the fifth embodiment, instead of the end 206b in the fourth embodiment, is grounded. Therefore, the gain leads 208 and 210 in the fifth embodiment are respectively disposed under the inner side and the outer side of the first (most-outer) coil turn 216 counted from the end 206a and respectively electrically connected in parallel to the inner side and the outer side of the coil turn 216, so that the sections of the coil turn 216 of the coil layer 206 and the gain leads 208 and 210 along a cross-sectional plane together have an upsidedown-U-shape. In addition, the materials and the functions of the gain leads 208 and 210 and other elements of the inductor structure 200 are similar to that of the fourth embodiment, so they are omitted to describe.

In summary, the above-described embodiments have at least following advantages:
1. The inductor structure provided by the present invention is able to effectively increase the section area of conductor to further reduce conductor loss.
2. The inductor structure provided by the present invention is able to prevent larger parasitic capacitance induced and thereby improve the quality of the inductor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An inductor structure, comprising:
a coil layer, disposed over a substrate and having a plurality of coil turns, wherein one of the coil turns of the coil layer is grounded; and
at least a gain lead, disposed under at least one of the inner side and the outer side of the grounded coil turn and electrically connected in parallel to the grounded coil turn, wherein the inner side and the outer side of the grounded coil turn are respectively defined as a side close to the inner portion of the inductor structure and a side departing from the inner portion of the inductor structure, and the width of the gain lead is less than the width of the grounded coil turn.

2. The inductor structure according to claim 1, wherein the width of the gain lead is less than a half of the width of the grounded coil turn.

3. The inductor structure according to claim 1, wherein the gain lead comprises:
at least a first gain lead, electrically connected to the inner side of the grounded coil turn; and
at least a second gain lead, electrically connected to the outer side of the grounded coil turn, wherein
the number of the first gain lead and the number of the second gain lead are the same.

4. The inductor structure according to claim 1, wherein the gain lead comprises:
at least a first gain lead, electrically connected to the inner side of the grounded coil turn; and
at least a second gain lead, electrically connected to the outer side of the grounded coil turn, wherein
the number of the first gain lead and the number of the second gain lead are different from each other.

5. The inductor structure according to claim 1, further comprising a plurality of via plugs disposed between the coil layer and the gain lead, wherein at least two ends of the gain lead are electrically connected to the grounded coil turn.

6. The inductor structure according to claim 1, wherein the sections of the coil layer and the gain lead along a cross-sectional plane together have an upsidedown-L-shape or an upsidedown-U-shape.

7. The inductor structure according to claim 1, the coil layer comprising:
a first spiral coil, having a first end and a second end, wherein the second end rotates in spiral way towards the inner portion of the first spiral coil; and
a second spiral coil, intertwisted with the first spiral coil, with the first spiral coil symmetrically disposed about a plane of symmetry and having a third end and a fourth end, wherein the fourth end rotates in spiral way towards the inner portion of the second spiral coil and is connected to the second end of the first spiral coil so as to form the coil layer having the coil turns, wherein a virtual grounding is formed at the most-inner coil turn of the coil layer, and the grounded coil turn is the most-inner coil turn.

8. The inductor structure according to claim 7, wherein the width of the gain lead is less than a half of the width of the most-inner coil turn.

9. The inductor structure according to claim 7, wherein the gain lead comprises:
at least a first gain lead, electrically connected to the inner side of the most-inner coil turn; and
at least a second gain lead, electrically connected to the outer side of the most-inner coil turn, wherein
the number of the first gain lead and the number of the second gain lead are the same.

10. The inductor structure according to claim 7, wherein the gain lead comprises:
at least a first gain lead, electrically connected to the inner side of the most-inner coil turn; and
at least a second gain lead, electrically connected to the outer side of the most-inner coil turn, wherein
the number of the first gain lead and the number of the second gain lead are different from each other.

11. The inductor structure according to claim 7, further comprising a plurality of via plugs disposed between the coil layer and the gain lead, wherein at least two ends of the gain lead are electrically connected to the most-inner coil turn.

12. The inductor structure according to claim 7, wherein the first spiral coil and the second spiral coil are interlaced with each other on the plane of symmetry and do not contact each other at the interlaced positions.

13. The inductor structure according to claim 7, wherein a pair of voltages with the same absolute levels but opposite electrical polarities are respectively applied to the first end and the third end.

14. The inductor structure according to claim 7, wherein the sections of the coil layer and the gain lead along a cross-sectional plane together have an upsidedown-L-shape or an upsidedown-U-shape.

15. The inductor structure according to claim 1, wherein the coil turns are formed in series, the coil layer has a first end and a second end, the first end is grounded, and the grounded coil turn is the first coil turn counted from the first end.

16. The inductor structure according to claim 15, wherein the width of the gain lead is less than a half of the width of the first coil turn.

17. The inductor structure according to claim 15, wherein the gain lead comprises:
- at least a first gain lead, electrically connected to the inner side of the first coil turn; and
- at least a second gain lead, electrically connected to the outer side of the first coil turn, wherein the number of the first gain lead and the number of the second gain lead are the same.

18. The inductor structure according to claim 15, wherein the gain lead comprises:
- at least a first gain lead, electrically connected to the inner side of the first coil turn; and
- at least a second gain lead, electrically connected to the outer side of the first coil turn, wherein the number of the first gain lead and the number of the second gain lead are different from each other.

19. The inductor structure according to claim 15, further comprising a plurality of via plugs disposed between the coil layer and the gain lead, wherein at least two ends of the gain lead are electrically connected to the first coil turn.

20. The inductor structure according to claim 15, wherein the sections of the coil layer and the gain lead along a cross-sectional plane together have an upsidedown-L-shape or an upsidedown-U-shape.

* * * * *